United States Patent [19]

Ikurumi et al.

[11] Patent Number: 6,081,613
[45] Date of Patent: *Jun. 27, 2000

[54] SYSTEM FOR INSPECTING AN APPEARANCE OF A PRINTED CIRCUIT BOARD

[75] Inventors: Kazuhiro Ikurumi, Katano; Masanori Yasutake, Hirataka; Osamu Nakao, Osaka; Masaharu Tsujimura, Neyagawa; Toshihiko Tsujikawa, Sakai; Kenji Okamoto, Hirakata, all of Japan

[73] Assignee: Matsushita Electric Industrial Co., Ltd., Osaka-fu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/518,812

[22] Filed: Aug. 24, 1995

[30] Foreign Application Priority Data

Aug. 24, 1994 [JP] Japan ..................................... 6-199363

[51] Int. Cl.⁷ ...................................................... G06K 9/00
[52] U.S. Cl. .............................................. 382/147; 348/87
[58] Field of Search ..................................... 382/107, 108, 382/141, 147, 149, 151, 317, 323; 358/411, 413, 471; 250/206, 206.1, 206.3, 562, 563; 348/87, 94, 95, 142; 364/490, 491; 356/237

[56] References Cited

U.S. PATENT DOCUMENTS

| | | |
|---|---|---|
| 3,346,692 | 10/1967 | Garfield et al. .......................... 358/496 |
| 4,092,632 | 5/1978 | Agulnek ................................... 382/323 |
| 4,639,790 | 1/1987 | Kusaka .................................... 382/323 |
| 4,701,804 | 10/1987 | Toyoda et al. ........................... 382/323 |
| 4,862,512 | 8/1989 | Hidaka et al. ........................... 358/471 |
| 4,878,119 | 10/1989 | Beikirch et al. ........................ 358/471 |
| 5,245,440 | 9/1993 | Sato ....................................... 358/488 |

FOREIGN PATENT DOCUMENTS

| | | |
|---|---|---|
| 55-87431 | 7/1980 | Japan . |
| 56-24998 | 3/1981 | Japan . |

*Primary Examiner*—Bhavesh Mehta
*Attorney, Agent, or Firm*—Wenderoth, Lind & Ponack, L.L.P.

[57] ABSTRACT

A motion of a printed circuit board (1) is detected by an encoder (4) arranged aside a belt conveyer (2), and the encoder generates a detection signal ($S_3$) which activates a timing signal generator unit (5) for generating an image pickup start timing signal which is fed to a time measuring unit (6) for measuring the image storing time which corresponds to the time interval of the image pickup start signal (S1). According to the image storing time, the image signal (S2) generated by the line CCD camera (3) is normalized by the normalizing calculation means (7), and thereafter, the mounting condition of the printed circuit board is judged by the image recognizing section (B) with the use of the image data (D) to thereby realize a simple and convenient mechanism at a low cost and at a high precision.

2 Claims, 8 Drawing Sheets

SYSTEM FOR INSPECTING AN APPEARANCE OF A PRINTED CIRCUIT BOARD

BACKGROUND OF THE INVENTION

1. Field of the Invention

The present invention relates to an inspecting system for inspecting a printed circuit board appearance, and in particular to an improvement of an image pickup section for use in the inspection system examining a component mounting condition on a printed circuit board.

2. Description of the Prior Art

Along with recent down-sizing trend of electronic machinery apparatuses, the down-sizing with high density in mounting of electronic components has been progressed to such an extent that visual confirmation thereof in a manufacturing line process is substantially impossible, and therefore, an inspection apparatus for automatically inspecting a printed circuit board appearance in a manufacturing line process is more important. Accordingly, in the inspection apparatus for inspection of a printed circuit board appearance, it is an important requirement to realize both a low price and high speed performance in together in the apparatus enabling the automatic inspection in a manufacturing line process.

Conventionally, there was employed a two-dimensional area sensor type CCD camera capable of picking up about 512×480 pixels in one area pickup operation as an image pickup means in which images of an inspection object are picked up by repeating the two-dimensional movement of the CCD camera with stopping of the movement using an X-Y turn table.

In order to realize a high speed performance in inspection of an object, as compared with the conventional two-dimensional area sensor type CCD camera, a demand for employing a one-dimensional scanner linear sensor type CCD camera (hereinafter, referred to as a "line CCD camera") is increased for use in the inspection apparatus, where the images of an object are picked up while the line CCD camera is linearly moved in one-dimension, thus eliminating the stopping time of the camera in movement to thereby realize a high speed inspection.

When a line CCD camera of a line sensor type is employed in the inspection apparatus for inspection of a printed circuit board appearance, because the line CCD camera has an image pickup width of several thousands pixels in one sensing line, the images in the lateral width of a printed circuit board can be collectively picked up by a one-line sensing operation of the line CCD camera. Therefore, the movement axes of the turn table for moving the CCD camera can be reduced by one axis as compared with the conventional inspection apparatus employing a two-dimensional area sensor type CCD camera, resulting in cost reduction of the apparatus.

However, in the case of employing a line CCD camera as an image pickup means in an inspection apparatus, because a positional control with high accuracy as well as a timing control with high accuracy in image pickup operation is essentially important, it is therefore required to drive the line CCD camera or the printed circuit board of the inspection object with use of a precision mechanism table for linear movement driven by a servo-motor, and the like, which causes an increase in cost of the apparatus.

A conventional inspection apparatus for inspection of a printed circuit board appearance using a line CCD camera of a line sensor type as an image pickup means is described below with reference to FIG. 7 and FIGS. 8A–8B.

Referring to FIG. 7, the inspection apparatus includes a servo-motor 12 for linearly moving a precision mechanism table 13 (hereinafter, referred to as a "table") in one dimension. Placed on the table 13, is a printed circuit board 1 having repeat patterns of chip elements and the like which the mounting condition thereof is an object to be inspected, and the placed printed circuit board is subjected to light scanning by means of a line CCD camera 3 to pick up images thereof. A camera control section 71 includes a camera controller unit 16 for generating an image pickup start timing signal S1 and further includes a timer 17 for measuring a time of generation of the image pickup start timing signal.

The inspection apparatus further includes an image recognizing section 72 which is comprised of an image data memory 8, an image recognizing unit 9 and a determination control unit 10. Reference numeral 14 denotes a driver unit for driving the servo-motor 12. The camera control section 71, image recognizing section 72 and the driver unit 14 are operatively connected to a machine controller 73 for controlling a CRT display, key board and the like.

With respect to the above mentioned conventional inspection apparatus for inspection of a printed circuit board appearance employing a line CCD camera, the interaction between the components thereof and the operation of each component are described below.

In the first step, a printed circuit board 1 which is an object to be inspected is placed on the table 13 which is moved by the servo-motor 12 driven by the driver unit 14.

In the next step, the table 13 is moved within a range under the image pickup sensing operation of the line CCD camera 3 at a constant speed in one direction (for example, in the direction shown by an arrow A), wherein an image pickup start timing signal $S_1$ is fed from the camera controller unit 16 to the line CCD camera 3 at predetermined time intervals measured by the timer 17 in the camera control section 71. At each time in response to the feeding of the signal S1, the image recognizing section 72 receives an image signal $S_2$ of one line of pixels, i.e., one pixel×N pixels, from the line CCD camera 3 to be stored in the image memory 8, where N denotes the number of the one-line pixels picked up by the line CCD camera.

Then, the output of the image memory 8 is fed to the image recognizing unit 9 in which the supplied image signal S2 is subjected to recognition process to obtain high and low levels of the image picture signals in every cycle of the repeat patterns. Subsequently, in the final step, it is determined by the determination control unit 10 whether or not the printed circuit board appearance is good, namely, whether or not the mounting condition of elements on the printed circuit board is accurate. When a defect or difference in position exists in the printed circuit board appearance, there is generated an abnormal signal which is compared with a reference signal to indicate the existence of a defect or deviation.

By this arrangement, the line CCD camera 3 picks up the picture image of the printed circuit board 1 collectively every one line scanning with the lateral width thereof corresponding to the image pickup width of several thousand pixels of the line CCD camera. Therefore, the movement axes of the printed circuit board 1 with respect to the line CCD camera 3 can be reduced by one axis as compared to the old conventional inspection apparatus employing the two-dimensional area sensor type CCD camera, resulting in the cost reduction of the apparatus.

However, in the line sensor type inspection apparatus, the printed circuit board 1 is placed on the precision mechanism table 13 which is driven by the high precision servo-motor 12, which causes an increase in the cost. This is because, when the image pictures of the printed circuit board are picked up using the line CCD camera 3, the accuracy in position and timing of the image pickup starting operation, i.e., the accuracy in the time interval of the image pickup start timing signal $S_1$ greatly affect the quality of the resultant image picture to be obtained.

The influence of the accuracy in position and time interval of the image pickup start timing signal on the quality of the resultant image picture is described below with reference to FIGS. 8A and 8B.

FIG. 8A shows an example of an image picture in the case where the image pickup start position with respect to the image pickup start timing signal is deviated from the accurate position. The deviation in the actual pickup position of an object al results in appearance as an elongation a2-1 and a contraction a2-2 on the resultant image picture a2, which deteriorates the image quality.

FIG. 8B shows an example in the case where the time intervals of generating the image pickup start timing signal are varied. Since the light storing time for an image picture on the CCD elements of the camera is determined by the time intervals between generation of subsequent two pulses of the image pickup start timing signal, therefore when the movement speed is high and the light storing time of sensing an object b1 is short relative to the accurate interval, there appears a dark zone b2-1 on the resultant image picture b2, and on the contrary, when the light storing time is long, there appears a bright zone b2-2 on the image picture b2. Thus, the difference in accuracy of time interval results in appearance of such as dark or bright zones of different accuracy on the resultant image picture.

These disturbances on the image picture greatly affects the inspection performance of the apparatus.

SUMMARY OF THE INVENTION

The present invention has been developed with a view to substantially solving the above described disadvantages. Accordingly, an essential objective of the present invention is therefore to provide an inspection system for inspection of a printed circuit board appearance by implementing an improved image pickup section having a high accuracy with low price for automatically inspecting the printed circuit board by using a line CCD camera.

In order to achieve the above objective, an inspection system for inspecting the appearance of an object, such as printed circuit board, appearance according to the present invention comprises: an image pickup for picking up an image of the object to be inspected; a linear mover for moving the inspection object along a single axis; a movement amount detector generating a detection signal for detecting a movement amount of the inspection object moved by the linear mover; and a timing signal generator for generating an image pickup start timing signal to be supplied to the image pickup based on the received detection signal from the movement amount detector.

The system further comprises: a time measurer which measures an image storing time based on a time interval of generating subsequent two pulses of the image pickup start timing signal generated by the timing signal generator; and a normalizing calculator for normalizing the image signal according to the image storing time fed from the time measurer.

According to another feature of the present invention, the image pickup includes a shutter for making a constant image storing time during which the image pickup executes the image pickup operation.

Therefore, according to the first aspect of the present invention, while moving the printed circuit board with a simple and convenient mechanism such as a belt conveyer, the position detection accuracy can be improved by detecting the movement of the printed circuit board with use of the movement amount detector such as an encoder, and the difference in accuracy of the image signal due to inaccuracy in time intervals can be normalized by the normalizing calculator for normalizing the image signal according to the image storing time. Thus, a low cost with high precision can be realized in appearance inspection of a printed circuit board.

Further according to the second aspect of the present invention, the calculation process of the image signal can be eliminated through picking up the images of the printed circuit board to be inspected by employing a line CCD camera including a shutter, the deterioration in accuracy in the calculation process can be removed, thus, to realize appearance inspection of a printed circuit board with higher precision.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
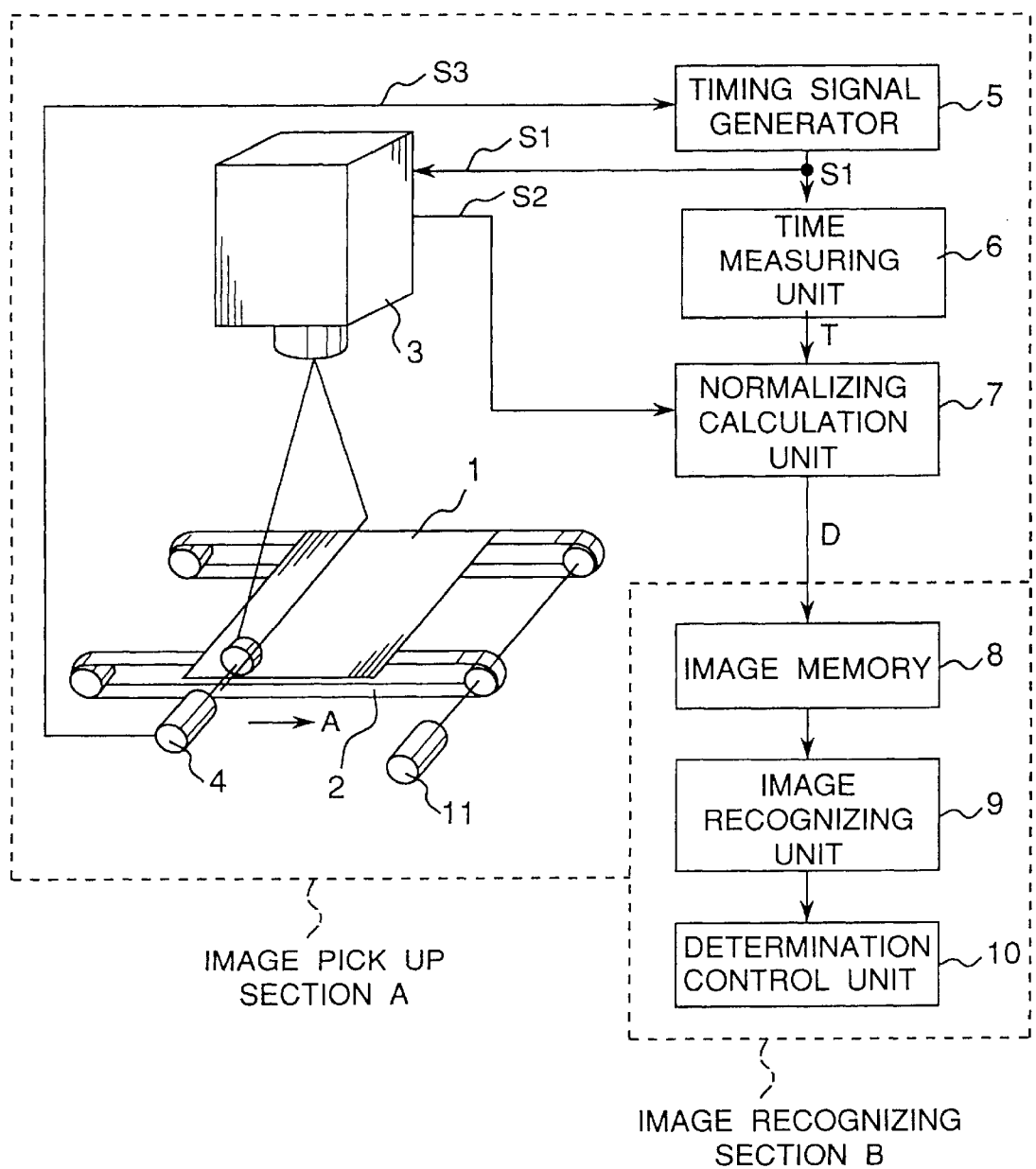
FIG. 1 is a block diagram showing a configuration of an inspection system for inspecting a printed circuit board appearance according to a first embodiment of the present invention.

Before the description proceeds, it is to be noted that, since the basic structure of the preferred embodiments is common to the conventional one, like parts are designated by the same reference numerals throughout the accompanying drawings.

Hereinbelow, preferred embodiments of the present invention are described with reference to the accompanying drawings.

FIG. 1 shows a configuration of a first embodiment of an inspection system for inspecting a printed circuit board appearance according to the present invention.

Referring to FIG. 1, the inspection system is comprised of an image pickup section (A) and an image recognizing section (B).

The image pickup section (A) includes a belt conveyer 2 serving as a linear moving means for carrying along a single axis a printed circuit board 1 which is an object to be inspected. The belt conveyer 2 is one-dimensionally driven at a roughly constant speed by a drive motor 11 or the like. In the image pickup section (A), a line CCD camera 3 serving as an image pickup means is provided for picking up images of an appearance of the printed circuit board which is an inspection object placed on the belt conveyer 2.

The line CCD camera 3 picks up the images of the inspection object by line scanning and generates an image signal S2 to be used for forming an image picture of the inspection object. An encoder 4 is provided beside the belt conveyer 2 for detecting a movement amount of the printed circuit board carried by the belt conveyer 2.

The image pickup section (A) further includes a timing signal generator unit 5 for generating an image pickup start timing signal S1 which is fed to the line CCD camera 3 based on a movement amount detection signal S3 of pulses transmitted from the encoder 4, a time measuring unit 6 for measuring an image storing time which corresponds to a time interval (T) of a generation of two consecutive pulses of the image pickup start signal S1, and a normalizing calculation unit 7 for normalizing the image signal S2 fed from the line CCD camera 3 in accordance with the image storing time (T) generated by the time measuring unit 6.

Figure 7:
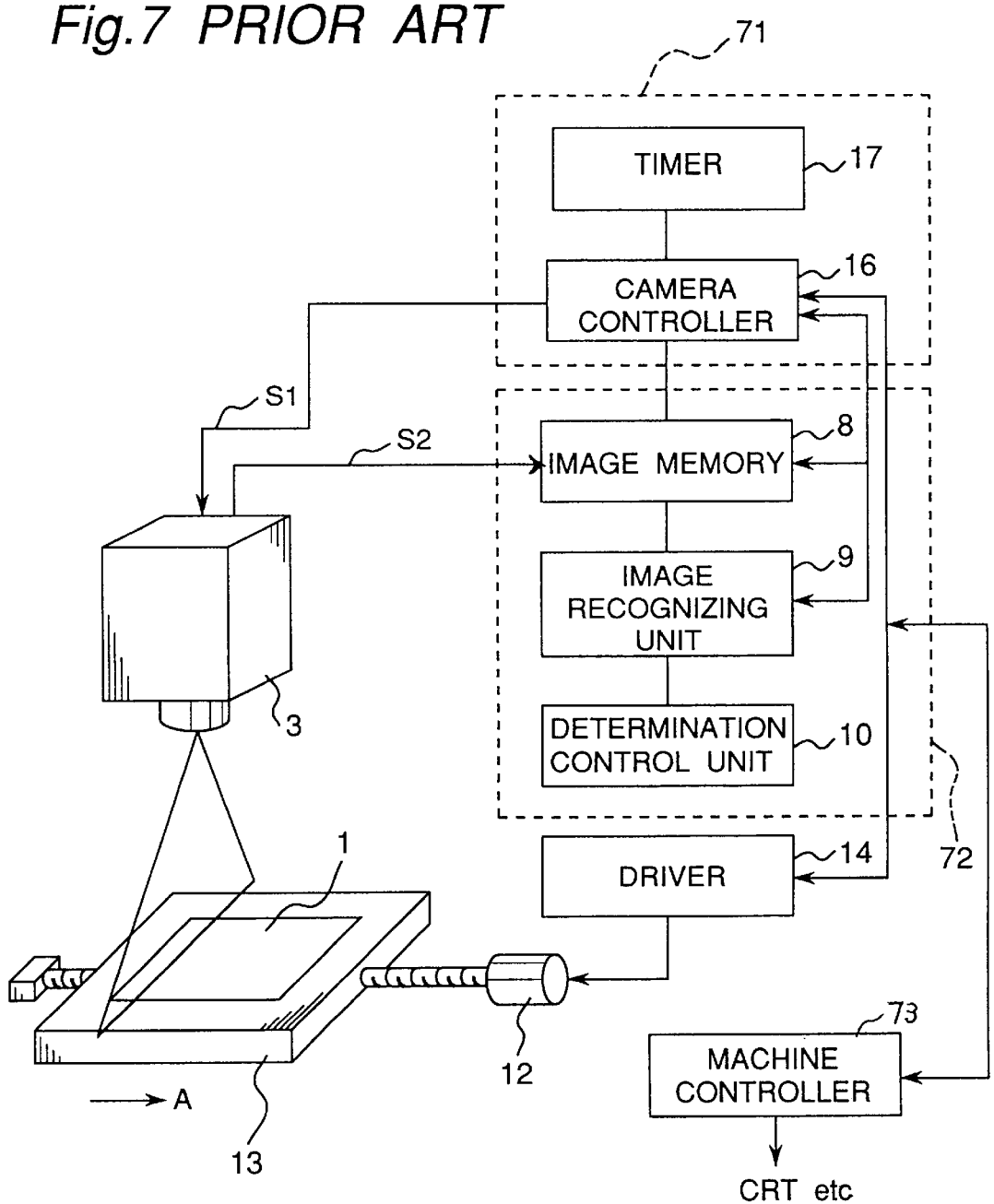
FIG. 7 is a block diagram showing a configuration of a conventional inspection apparatus for inspecting a printed circuit board appearance.
Figure 8A:
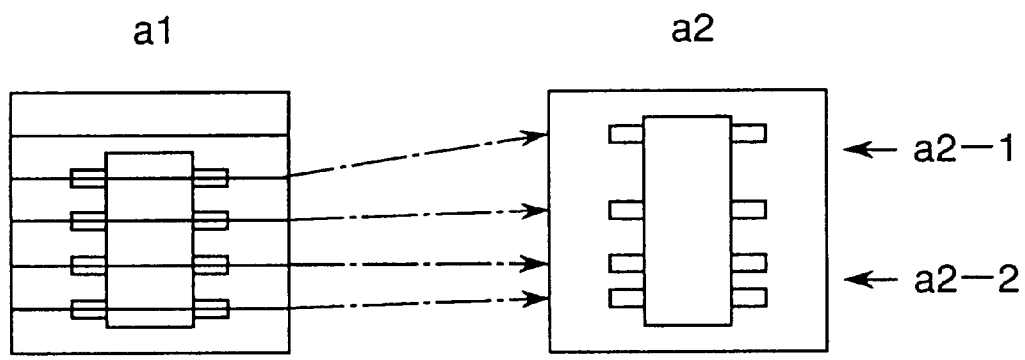
FIGS. 8A and 8B are diagrams each for explaining the relation between the image pickup start timing signal and the resultant image picture thereby.
Figure 8B:
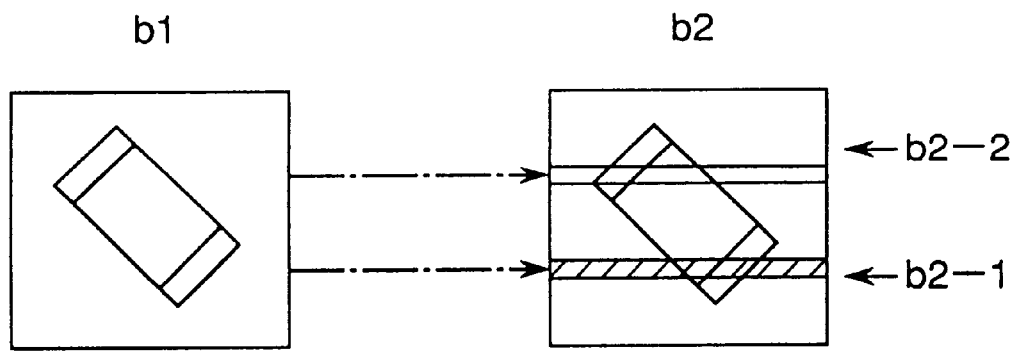

The image recognizing section (B) includes an image memory 8, an image recognizing unit 9, and a determination control unit 10, the construction of which is similar to that of the conventional one as shown in FIG. 7 and the detailed explanation thereof is omitted here.

With respect to the above mentioned inspection system of the first embodiment, the interaction between the components thereof and the operation of each component are described below.

In the image pickup section (A), in the first step, the printed circuit board 1 is moved by carrying on the belt conveyer 2 and the like in the range under the image pickup operation of the line CCD camera 3 in one direction approximately at right angles to the lateral one line sensing direction of the CCD camera, for example, in the direction shown by an arrow A in FIG. 1.

The movement amount of the inspection object, i.e., the printed circuit board 1, is detected by the encoder 4 provided beside the belt conveyer 2, which the detected value of the movement amount is generated by the encoder 4 as the pulses represented by the detection signal S3. The detection signal S3 is fed to the timing signal generator unit 5.

In response to receipt of the detection signal S3 of a predetermined pulse number, the timing generator unit 5 generates an image pickup start timing signal S1 which is simultaneously fed to both the line CCD camera 3 and the time measuring unit 6 based on the predetermined pulse number of the received signal S3 corresponding to the movement amount of the inspection object detected by the encoder 4. The time measuring unit (6) measures an image light storing time (T) which is a time interval of two consecutive pulses of the image pickup start timing signal S1.

In more detail, the image pickup start timing signal S1 generated by the timing signal generator unit 5 is supplied to the line CCD camera 3 as well as to the time measuring unit 6 at predetermined time intervals (T) based on the predetermined pulse number of the detection signal S3, so that the time interval (T) between two consecutive pulses of the image pickup start timing signal S1 is measured by the time measuring unit 6 to thereby calculate the image storing time during which the image pickup operation is performed and the image picked up signal of the object is stored onto the CCD elements of the line CCD camera 3.

Figure 2:
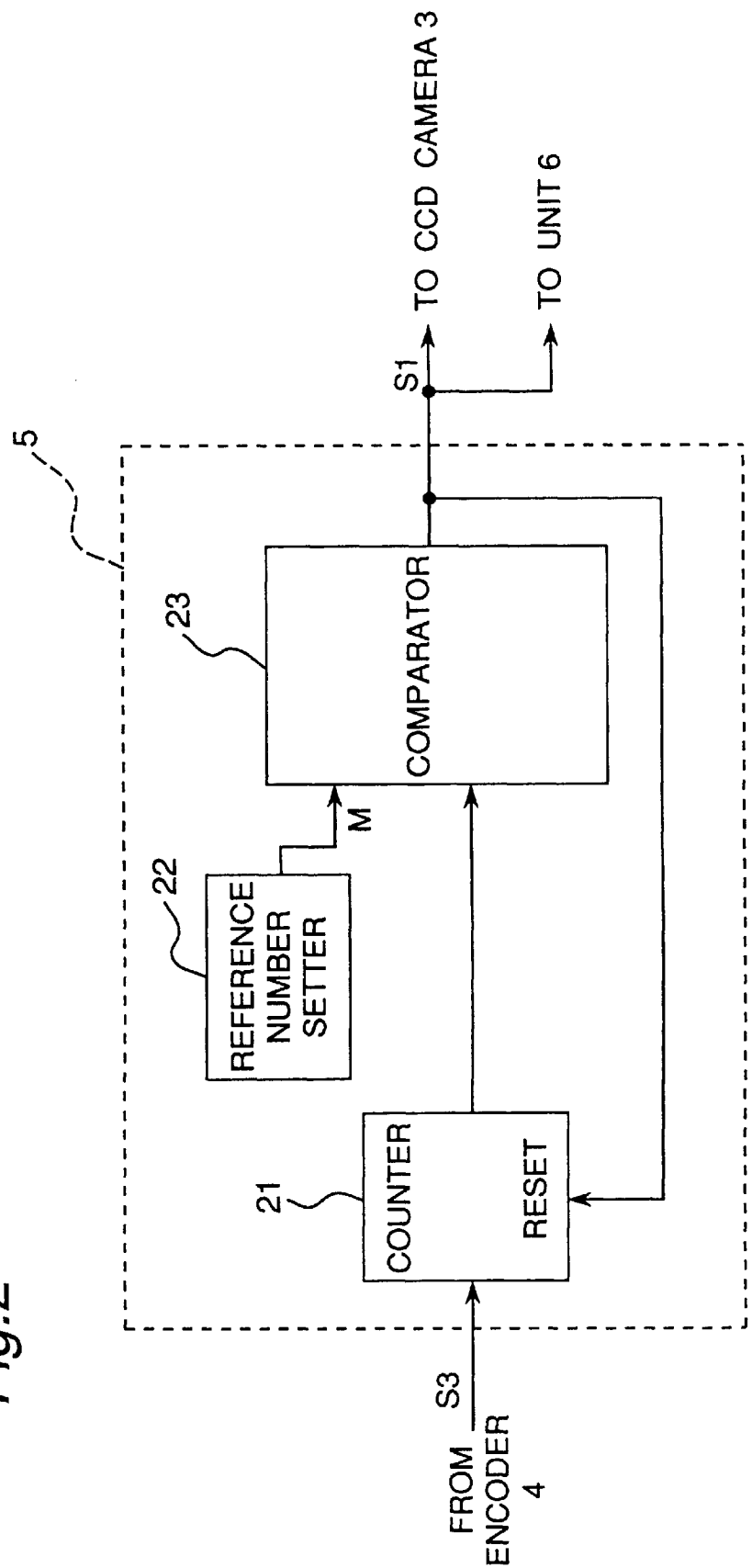
FIG. 2 is a block diagram showing a timing signal generator of the first embodiment.

FIG. 2 shows an example of a construction of the timing signal generator unit 5, which includes a counter 21 for counting the pulse number of the detection signal S3 supplied from the encoder 4, a reference number setter unit 22 for setting the pulse number to start the image-pickup operation, and a comparator 23 for comparing the outputs of the setter unit 22 and the counter 21.

Referring to FIG. 2, the pulses of the detection signal S3 generated by the encoder 4 are supplied to the counter 21 and the pulse number of the supplied detection signal S3 is counted. In the reference number setter unit 22, there is previously set a predetermined value (M) with respect to the counted number of the pulses at which the lateral one-line image pickup operation is started by generating a pulse of the image pickup start timing signal S1 when the counted pulse number of the supplied detection signal S3 is coincident with the preset value (M). The pulse number counted by the counter 21 and the preset value (M) of the reference setter unit 22 are both fed to the comparator 23 in which the both inputted values are compared with each other, and when the counted pulse number becomes coincident with the preset value (M), the image pickup start timing signal S1 is generated as an output of the timing signal generator unit 5, and at the same time, the output signal (S1) of the comparator 23 is also fed back to a reset terminal of the counter 21 for resetting the count value of the counter 21.

Figure 3A:
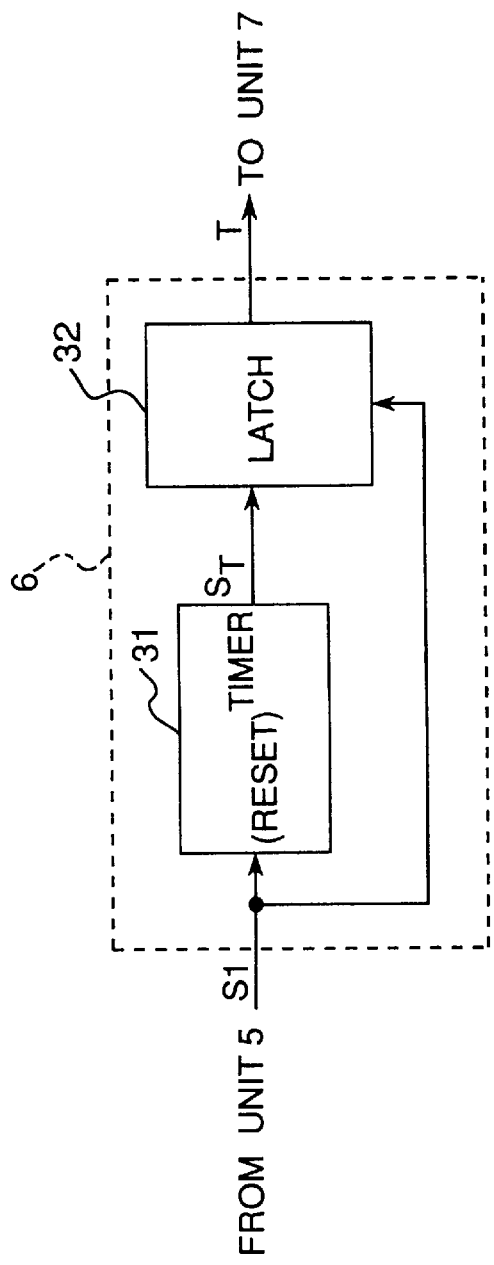
FIG. 3A is a block diagram showing a time measuring unit of the first embodiment.

FIG. 3A shows an example of a construction of the time measuring unit 6, which includes a timer 31 and a latch unit 32.

Figure 3B:
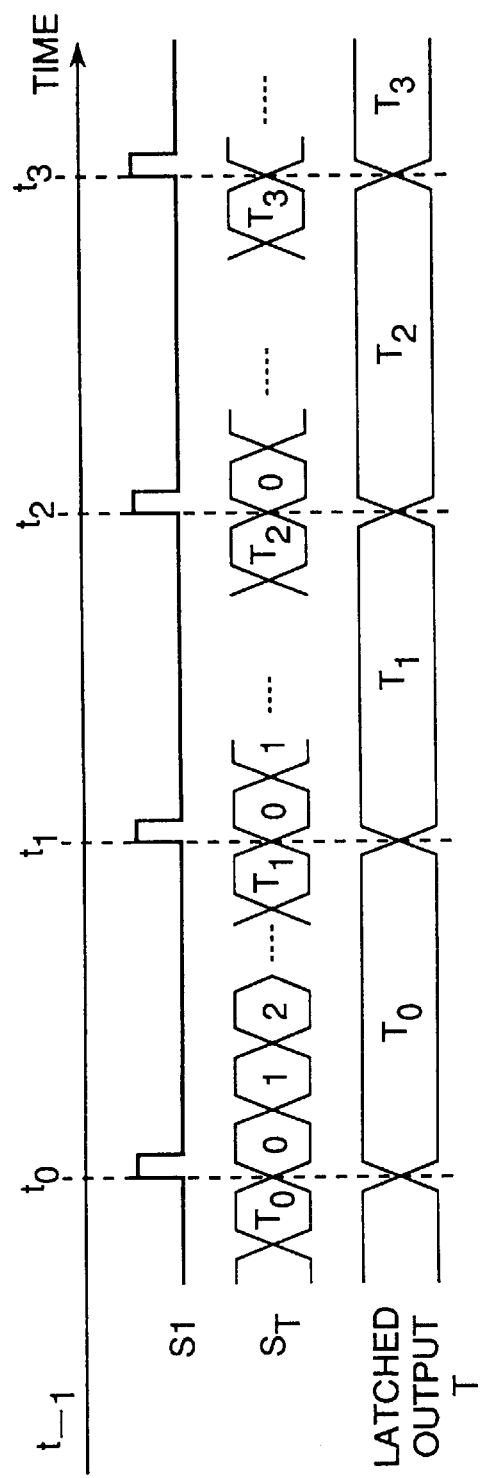
FIG. 3B is a timing chart for explaining an operation of the time measuring unit of FIG. 3A.

FIG. 3B shows a timing chart for explaining the relation between the outputs of the timer 31 and the latch unit 32 with respect to the image pickup start timing signal S1.

Referring to FIGS. 3A and 3B, the image pickup start timing signal S1 output from the timing signal generator unit 5 is fed to a reset terminal of the timer 31 for resetting the time count thereof and also fed to an input terminal of the latch unit 32 at the same time. The output signal $S_T$ of the timer 31 is fed to another input terminal of the latch unit 32, which generates the output values of the time intervals $T_0$, $T_1$, $T_2$, . . . (represented by "T") as the latched output signal during the first one-line sensing period from $t_0$ to $t_1$, second one-line sensing period from $t_1$ to $t_2$, third one-line sensing period $t_2$–$t_3$, . . . , respectively. The time intervals $T_0$, $T_1$, $T_2$. . . are the values calculated by subtractions between times $t_0$–$t_{-1}$, $t_1$–$t_0$, $t_2$–$t_1$, . . . , respectively, where the times $t_{-1}$, $t_0$, $t_1$, $t_2$, . . . represent image-pickup start timings, i.e., activation timings for generating a pulse of the signal S1.

Alternatively, the time measuring unit 6 may include the same construction as that of the timing signal generator unit 5 so as to produce the image pickup start timing signal S1 in accordance with receipt of the detection signal S3 from the encoder 4.

In the next step, the image signal S2 of the inspection object taken by the line CCD camera 3 is fed to the normalizing calculation unit 7 for subjecting the image signal S2 to a normalizing process in accordance with the image storing time (T) supplied from the time measuring unit 6 to thereby obtain image picture data D.

Figure 4:
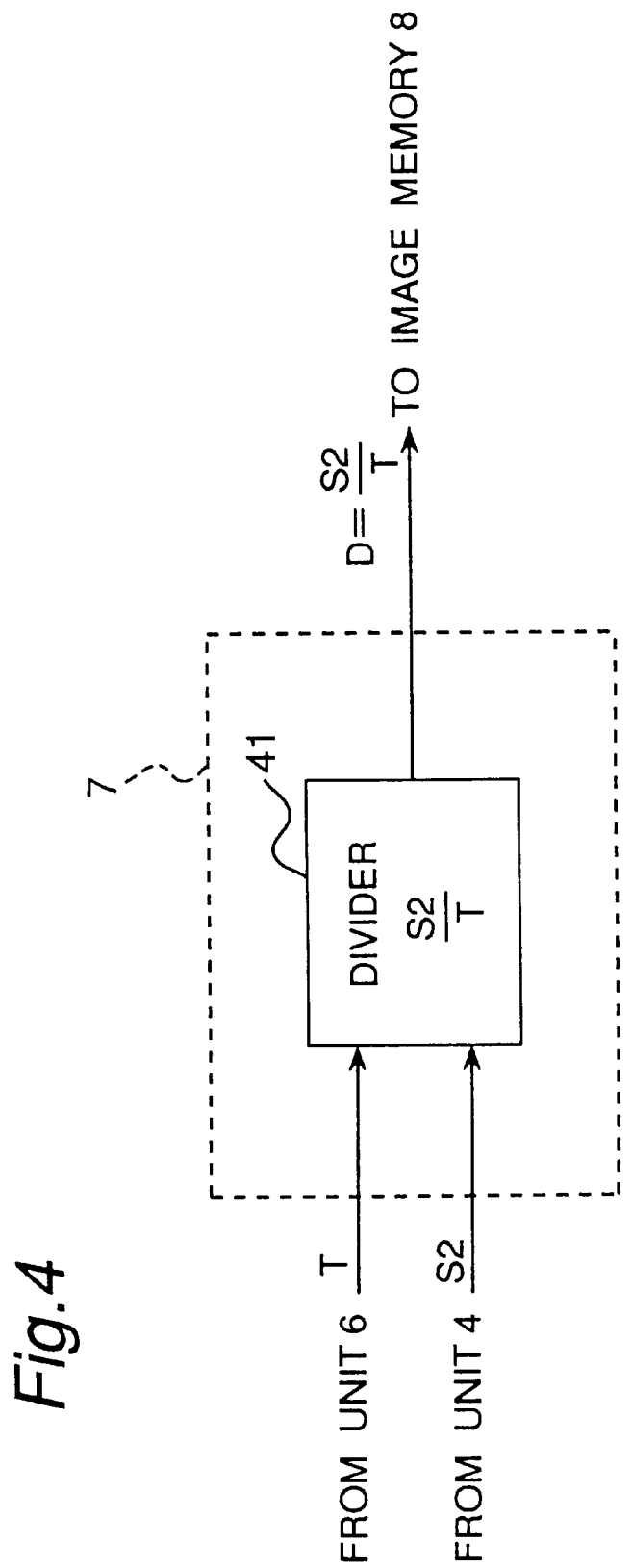
FIG. 4 is a block diagram showing a normalizing calculation unit of the first embodiment.

FIG. 4 shows an example of a construction of the normalizing calculation unit 7 which is comprised of a divider 41. As shown in FIG. 4, the divider 41 is supplied with the time interval T output from the time measuring unit 6 and with the image signal S2 transmitted from the CCD camera 3 to thereby perform a calculation of a division S2/T to be generated as an image picture data D.

Figure 5:
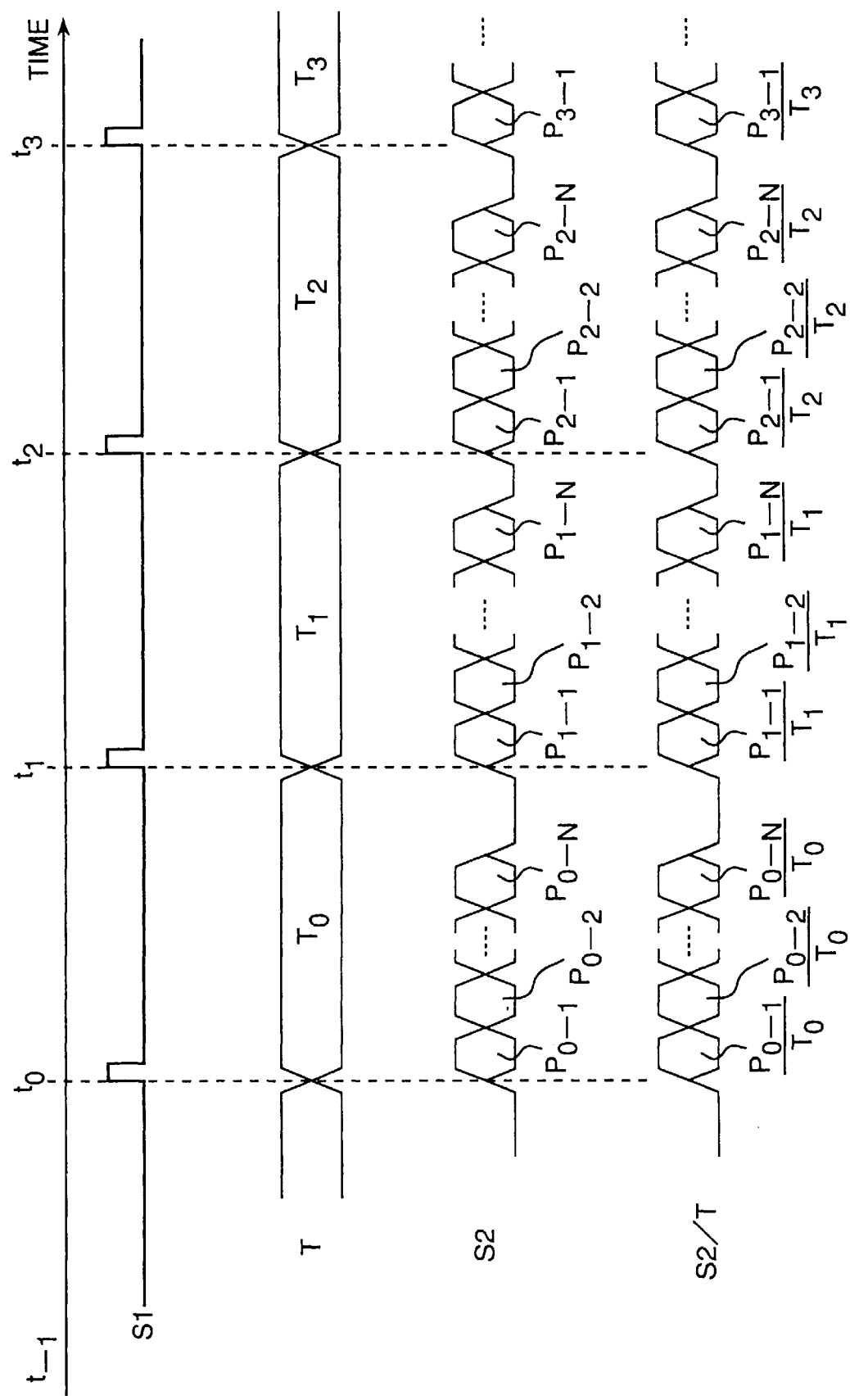
FIG. 5 is a timing chart for explaining an entire operation of the inspection system of the first embodiment.

In more detail, as shown in a timing chart of FIG. 5 explaining the relation of the entire operation of the apparatus, in the first one line sensing operation of the CCD camera during the period of $T_1$, the CCD camera generates a picked up image signal S2 of pixel strings of $P_{1-1}=(T_1, p_1)$, $P_{1-2}=(T_1, p_2)$, $P_{1-3}=(T_1, p_3)$, ... $P_{1-N}=(T_1, p_N)$, where $p_1, p_2, p_3, \ldots p_N$ represent first, second, third ..., and N-th pixels. Similarly, in the second one line sensing operation during the period of $T_2$, the CCD camera generates a picked up image signal S2 of pixel strings of $P_{2-1}=(T_2, p_1)$, $P_{2-2}=(T_2, p_2)$, $P_{2-3}=(T_2, p_3)$, ... $P_{2-N}=(T_2, p_N)$. These operations are repeated in a similar manner at every image-pickup operations. Thus, the divider 41 generates the normalized image data D (=S2/T), namely, data strings of $(T_1, p_1)/T_1$, $(T_1, p_2)/T_1$, $(T_1, p_3)/T_1$, ... $(T_1, p_N)/T_1$ in the first one line pickup operation, and data strings of $(T_2, p_1)/T_2$, $(T_2, p_2)/T_2$, $(T_2, p_3)/T_2$, ... $(T_2, p_N)/T_2$ in the second one line pickup operation, and the like, in the subsequent one line pickup operations, similarly.

Then, in the image recognizing section (B), the image picture data D generated by the normalizing calculation unit 7 is taken into the image memory 8 and then subjected to a recognition process in the image recognizing unit 9. In the final step, it is judged by the determination control unit 10 whether or not the inspection object, i.e., the printed circuit board appearance, is good, so that the mounting condition of chip elements on the printed circuit board is judged.

Figure 6:
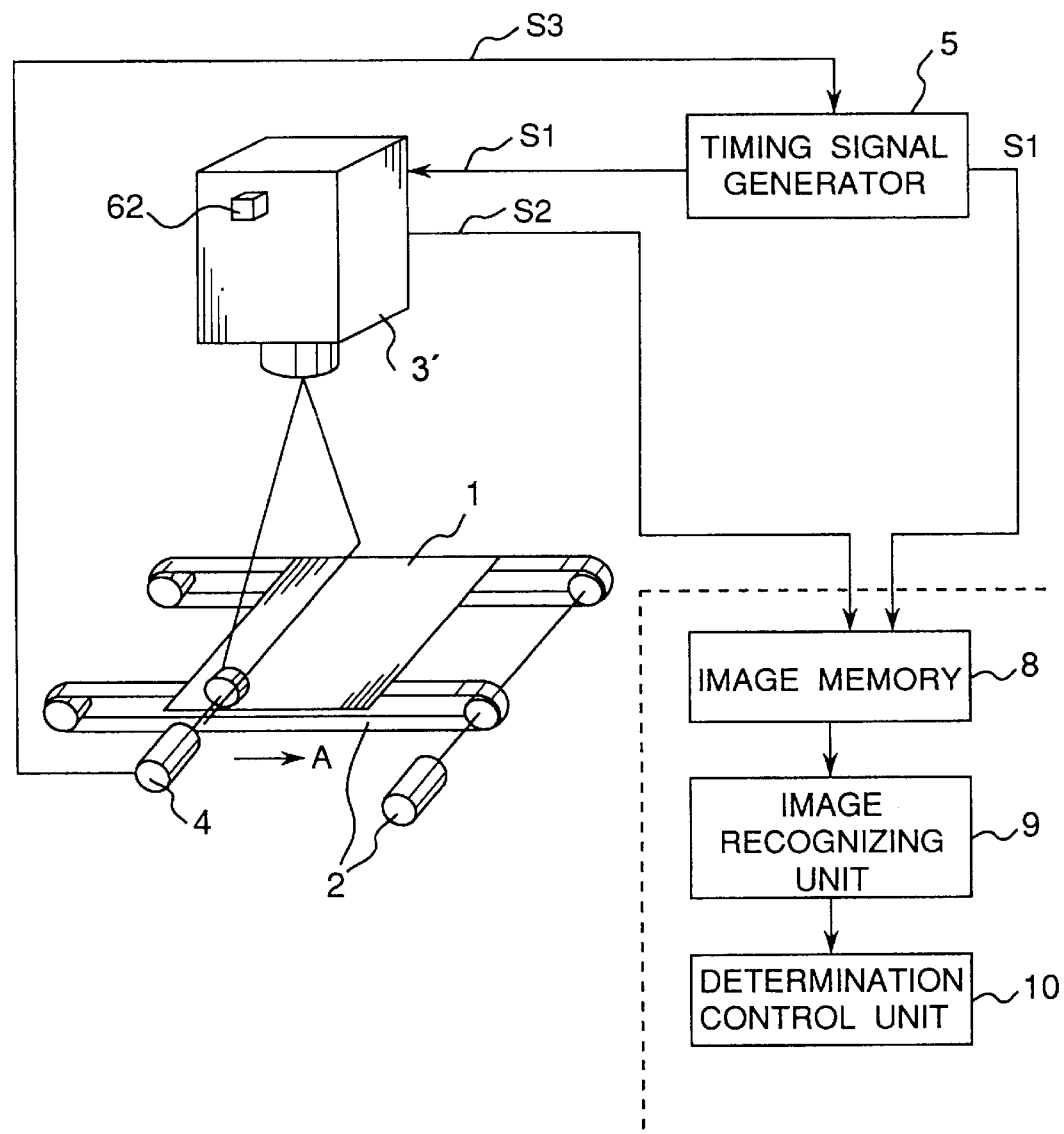
FIG. 6 is a block diagram showing a configuration of an inspection system for inspecting a printed circuit board appearance according to a second embodiment of the present invention.

FIG. 6 shows a configuration of a second embodiment of an inspection system according to the present invention.

Referring to FIG. 6, the inspection system includes a line CCD camera 31 having, for example, an electronic shutter unit 62 to be switched ON and OFF of which the ON time period of the shutter unit 62 is constant.

With respect to the inspection system of the second embodiment, the relation between respective components and the operation thereof are described below.

A printed circuit board 1 which is an object to be inspected is moved in a range under the image-pickup operation of the line CCD camera 31, along a single axis (for example, in a direction shown by an arrow A) by means of a belt conveyer 2. The movement amount of the printed circuit board 1 is detected by the encoder 4 arranged beside the belt conveyer 2. An image pickup start timing signal S1 is supplied from the timing generator unit 5 to the line CCD camera 11 at a predetermined time interval based on the detection signal S3 supplied from the encoder 4.

Alternatively, the output (S3) of the encoder 4 may be directly supplied to the CCD camera 31.

Then, the image signal S2 of the inspection object picked up by the line CCD camera is taken into the image memory 8 in the image recognizing section and then processed by the image recognizing section 9 based on the image pickup start timing signal S1 fed by the timing signal generator unit 5. In the final step, it is judged by the determination control section 10 whether or not the mounting condition of the printed circuit board is good.

By this arrangement of the second embodiment of the present invention, by providing an electronic shutter unit 12 in the line CCD camera, the variation or difference in time intervals T (i.e., $T_0, T_1, T_2, \ldots$) can be avoided by setting a predetermined time interval Tc of the ON time period of the shutter which the time interval Tc is a constant value smaller than any one of the image storing time periods, namely, within any one of the time intervals T.

As described above, in the first aspect of the present invention, the position accuracy is attained with a simple and convenient mechanism such as a belt conveyer by detecting the motion of the printed circuit board using an encoder, and the difference or variation in the accuracy of the image signal due to the variation in image-pickup start timing is normalized by the normalizing calculation unit according to the image storing time, thus, to realize a low cost and high precision inspection. Therefore, it becomes possible to reduce the position accuracy and timing accuracy in the moving means for moving the printed circuit board with a high precision mechanism table and a high precision motor as employed in the conventional example.

Furthermore, in the second aspect of the present invention, it becomes possible to remove the deterioration in the accuracy arising in the calculation of the image signal by the image pickup means of a line CCD camera including an electronic shutter unit thereby to realize a further higher precision inspection.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An inspection system for inspecting an object, said inspection system comprising:

an image pickup means for scanning an image of the object to be inspected and for generating an image signal;

a linear moving means for moving the inspection object along a single axis;

a movement amount detecting means for detecting a movement amount of the inspection object moved by said linear moving means and for generating a detection signal corresponding to the movement amount; and a timing signal generating means for generating an image pickup start timing signal to be supplied to said image pickup means based on the detection signal generated by said movement amount detecting means;

wherein said timing signal generating means includes a counter means for counting the pulse number of the detection signal supplied from said movement amount detecting means, a reference setter means for setting the pulse number to start the image pickup operation, and a comparing means for comparing the outputs of said reference setter means and said counter means.

2. An inspection system for inspecting an object, said inspecting system comprising:

an image pickup means for scanning an image of the object to be inspected and for generating an image signal;

a linear moving means for moving the inspection object along a single axis;

a movement amount detecting means for detecting a movement amount of the inspection object moved by said linear moving means and for generating a detection signal corresponding to the movement amount;

a timing signal generating means for generating an image pickup start timing signal to be supplied to said image pickup means based on the detection signal generated by said movement amount detecting means;

a time measuring means for measuring an image storing time based on the image pickup start timing signal supplied from said timing signal generating means; and a normalizing calculation means for normalizing the image signal supplied from said image pickup means according to the image storing time fed from said time measuring means;

wherein said time measuring means includes a timer which is reset in response to receipt of a pulse of the image pickup start timing signal and a latch unit which receives an output of said timer as well as the image pickup start timing signal.

* * * * *